(12) United States Patent
Shibata et al.

(10) Patent No.: US 7,949,220 B2
(45) Date of Patent: May 24, 2011

(54) HYBRID OPTICAL/ELECTRICAL MIXED CIRCUIT BOARD

(75) Inventors: Tomoaki Shibata, Ibaraki (JP); Masato Miyatake, Ibaraki (JP); Atsushi Takahashi, Ibaraki (JP); Masatoshi Yamaguchi, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 12/374,121

(22) PCT Filed: Jul. 19, 2007

(86) PCT No.: PCT/JP2007/064278
§ 371 (c)(1),
(2), (4) Date: Jan. 16, 2009

(87) PCT Pub. No.: WO2008/023517
PCT Pub. Date: Feb. 28, 2008

(65) Prior Publication Data
US 2009/0257707 A1    Oct. 15, 2009

(30) Foreign Application Priority Data
Jul. 20, 2006 (JP) .................................. 2006-198169

(51) Int. Cl.
*G02B 6/12* (2006.01)
*G02B 6/13* (2006.01)
(52) U.S. Cl. .......................... 385/129; 385/131; 385/132
(58) Field of Classification Search .................... None
See application file for complete search history.

(56) References Cited

U.S. PATENT DOCUMENTS

| 6,524,717 | B1  |   | 2/2003 | Takano et al. |
|---|---|---|---|---|
| 7,040,011 | B2 | * | 5/2006 | Tanaka et al. .................... 29/832 |
| 2002/0029906 | A1 |   | 3/2002 | Echigo et al. |
| 2004/0063001 | A1 | * | 4/2004 | Wu et al. ........................... 430/5 |
| 2006/0057469 | A1 | * | 3/2006 | Kureishi et al. .................... 430/5 |
| 2006/0098933 | A1 | * | 5/2006 | Shelnut et al. ................ 385/145 |
| 2007/0190886 | A1 | * | 8/2007 | Satoh et al. ..................... 445/24 |
| 2010/0134663 | A1 | * | 6/2010 | Yokozawa .................... 348/273 |

FOREIGN PATENT DOCUMENTS

| JP | 56075650 | A | * | 6/1981 |
|---|---|---|---|---|
| JP | 60-122933 |   |   | 7/1985 |
| JP | 62-162534 |   |   | 7/1987 |
| JP | 02-260490 |   |   | 10/1990 |
| JP | 07-084374 |   |   | 3/1995 |
| JP | 07084374 | A | * | 3/1995 |

(Continued)

OTHER PUBLICATIONS

Chinese Official Action issued May 11, 2010, for Application No. 2007800273998.6.

(Continued)

*Primary Examiner* — Michelle R Connelly Cushwa
(74) *Attorney, Agent, or Firm* — Antonelli, Terry, Stout & Kraus, LLP.

(57) ABSTRACT

The present invention provides a hybrid optical/electrical circuit board in which an optical waveguide prepared by an exposing and developing step is combined with an electric circuit, wherein a printed wiring board containing an inorganic filler and a light absorber is used, and it has an optical waveguide core pattern having a high resolution and makes it possible to raise a density of optical wiring.

11 Claims, 1 Drawing Sheet

(a) Laminating and curing a resin film for forming a lower cladding layer (b) Laminating a resin film for forming a core layer (c) Exposure (d) Developing a core pattern (e) Laminating and curing a resin film for forming an upper cladding layer

FOREIGN PATENT DOCUMENTS

| | | |
|---|---|---|
| JP | 08-179509 | 7/1996 |
| JP | 2004-020767 | 1/2004 |
| JP | 2005-146085 | 6/2005 |
| JP | 2006-022317 | 1/2006 |
| JP | 2006022317 A * | 1/2006 |
| WO | WO 2004/095093 | 11/2004 |

OTHER PUBLICATIONS

Extended European Search Report, including Supplementary European Search Report and European Search Opinion, dated Jun. 17, 2010, for Application No. 07828160.7-1232/2045635.

* cited by examiner

[Fig 1]
(a) Laminating and curing a resin film for forming a lower cladding layer
(b) Laminating a resin film for forming a core layer
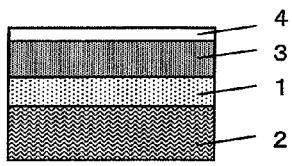
(c) Exposure
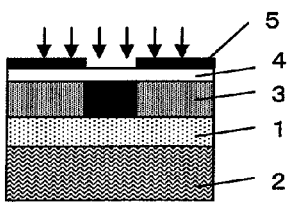
(d) Developing a core pattern
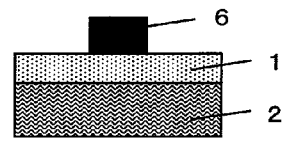
(e) Laminating and curing a resin film for forming an upper cladding layer
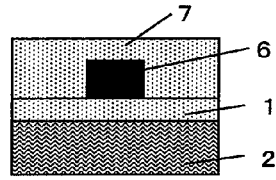
[Fig 2]
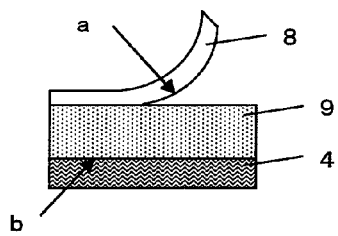
[Fig 3]
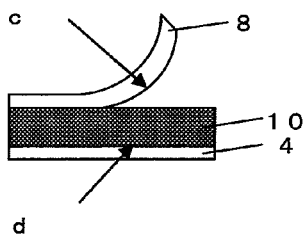

HYBRID OPTICAL/ELECTRICAL MIXED CIRCUIT BOARD

BACKGROUND OF THE INVENTION

The present invention relates to a hybrid optical/electrical circuit board which has an optical waveguide core pattern having a high resolution and which makes it possible to raise a density of optical wiring.

RELATED ART

In line with an increase in an information capacity, development of optical interconnection techniques in which optical signals are used not only in the communication field such as a main line and an access system but also for information processing in a router and a server is actively promoted.

To be specific, hybrid optical/electrical circuit boards in which an electric wiring board is combined with an optical transmission path are developed in order to use light for short distance signal transmission between boards or in a board in router and server devices.

Optical waveguides which have a high design freedom and make it possible to raise a density as compared with optical fibers are preferably used as an optical transmission path. Among them, optical waveguides prepared by using polymer materials which are excellent in a processability and an economical efficiency are promising, and an exposure and development method usually used in resists for printed wiring boards is advantageous as a production process therefor in terms of a productivity and a cost (refer to, for example, a patent document 1).

At present, a wiring density of a 250 µm pitch is required to an optical waveguide used for a hybrid optical/electrical circuit board considering connection with commercially available optical element arrays, to be specific, VCSEL (vertical cavity surface emitting laser) arrays, PD (photo diode) arrays and multicore ribbon optical fibers.

However, it is expected that an increase in a density of optical wiring is expedited more and more in the future, and it is expected as well that the pitch described above is made narrower than 250 µm and that optical wiring is required as well to be further raised in a resolution in order to meet the above matter.

Printed wiring boards blended with an inorganic filler for the purpose of providing a high elastic modulus and a high heat resistance are suited for a printed wiring board used as an optical/electrical circuit board.

However, according to investigations made by the present inventors, it has become clear that when a printed wiring board containing an inorganic filler in a base material is used as a hybrid optical/electrical circuit board, exposing light to define waveguide core patterns is scattered and reflected to exert an effect on a resolution of an optical waveguide, and it has been a problem in an increase in a density of optical wiring.

Patent document 1: Japanese Patent Application Laid-Open No.

DISCLOSURE OF THE INVENTION

An object of the present invention is to provide a hybrid optical/electrical circuit board which has an optical waveguide (optical wiring) core pattern having a high resolution and which makes it possible to raise a density of optical wiring.

Intensive investigations repeated by the present inventors in order to solve the problems described above have resulted in finding that the problems described above can be solved by using a printed wiring board containing an inorganic filler and a light absorber, and they have come to complete the present invention. That is, the present invention provides:

(1) a hybrid optical/electrical circuit board in which an optical waveguide prepared by an exposing and developing step is combined with an electric circuit, wherein a printed wiring board containing an inorganic filler and a light absorber is used, (2) the hybrid optical/electrical circuit board according to the above item (1), wherein the light absorber is a black dye, (3) the hybrid optical/electrical circuit board according to the above item (1) or (2), wherein a surface of the printed wiring board has a reflectance of 0.2% or less in a wavelength of an exposing light used for forming the optical waveguide and (4) the hybrid optical/electrical circuit board according to any of the above items (1) to (3), wherein a resin film for forming an optical waveguide is used for at least one of a core and a cladding layer of an optical waveguide.

The hybrid optical/electrical circuit board of the present invention has core patterns in an optical waveguide having a high resolution and makes it possible to raise a density of optical wiring by using the core pattern.

Further, the hybrid optical/electrical circuit board of the present invention has an appearance in which a basic color is black and is highly visible in an electric circuit (wiring) pattern and an optical waveguide core pattern, and it is excellent in distinction of the quality of the above patterns, mounting of elements and outline processing.

BRIEF EXPLANATION OF THE DRAWINGS

FIG. 1 is an explanatory drawing for one example of a production process for the hybrid optical/electrical circuit board of the present invention.

FIG. 2 is an explanatory drawing for one example of a resin film for forming a cladding which is used for producing the flexible optical waveguide of the present invention.

FIG. 3 is an explanatory drawing for one example of a resin film for forming a core which is used for producing the flexible optical waveguide of the present invention.

EXPLANATION OF CODES

1 Lower cladding layer
2 Printed wiring board
3 Core layer
4 Base film
5 Photo mask
6 Core pattern
7 Upper cladding layer
8 Protective film
9 Resin film for forming a cladding layer
10 Resin film for forming a core layer

BEST MODE FOR CARRYING OUT THE INVENTION

A hybrid optical/electrical circuit board shown in, for example, FIG. 1(e) can be given as one embodiment of the hybrid optical/electrical circuit board of the present invention.

That is, it is a hybrid optical/electrical circuit board having on a printed wiring board 2, a core pattern 6 having a high refractive index, a lower cladding layer 1 having a low refractive index and an upper cladding layer 7.

The core pattern 6 can be formed, as shown in FIGS. 1(*c*) and (*d*), by exposing and developing a core layer 3.

The printed wiring board containing an inorganic filler and a light absorber which is used for the hybrid optical/electrical circuit board of the present invention can be produced by following procedure. First, the vanish is prepared by blending a thermosetting resin composition with an inorganic filler used for improving the mechanical characteristics and the thermal characteristics and a light absorber (for example, a black dye and the like) used for reducing scattering and reflecting of exposing light by the inorganic filler. Next, to prepare a pre-preg, a fiberglass fabric is impregnated with the above vanish and drying. Then, to obtain a laminated board, a single sheet or desired sheets of the pre-preg is heated, pressed and molded. An electrical circuit is formed on a surface of the fabricated laminated board as a substrate.

Usually, when producing the laminated board, a metal foil is superposed thereon at the same time to prepare a metal foil-clad laminated board, and the above metal foil is etched to form a circuit, whereby a printed wiring board is produced.

The inorganic filler shall not specifically be restricted, and used are, for example, calcium carbonate, alumina, titanium oxide, mica, aluminum carbonate, aluminum hydroxide, magnesium silicate, aluminum silicate, silica, glass short fibers and various whiskers such as aluminum borate whiskers, silicon carbide whiskers and the like.

The inorganic filler may be used alone or in combination of two or more kinds thereof.

A blending amount of the inorganic filler shall not specifically be restricted, and a proportion of the inorganic filler based on the total amount of the solid matters contained in the resin composition (for example, a resin composition vanish) is usually 15 to 75% by volume.

A proportion of the inorganic filler is preferably 20 to 70% by volume, more preferably 25 to 65% by volume.

If a blending amount of the inorganic filler is 15 to 75% by volume, the sufficiently high mechanical characteristics and thermal characteristics can be obtained.

Measurement of a blending amount of the inorganic filler shall not specifically be restricted, and the blending amount is usually calculated by determining a proportion from a mass of a cured resin composition containing the inorganic filler and a mass of inorganic components remaining after thermally treating the resin composition at 400 to 700° C. for several hours and reducing the above proportion to a volume ratio based on a specific gravity of a cured resin composition containing no inorganic filler and a specific gravity of the inorganic filler.

As described in, for example, Japanese Patent Application Laid-Open No. 301534/2000, a silicone polymer can be blended for the purpose of enhancing a dispersibility of the inorganic filler in the cured resin composition.

The inorganic filler is subjected preferably to surface treatment by the above silicone polymer.

The above silicone polymer can be added directly to the inorganic filler-containing resin composition, and the inorganic filler is subjected as well to surface treatment by the above silicone polymer according to the above method.

The light absorber is a colored colorant such as a dye and the like, and it is preferably black.

The black dye shall not specifically be restricted, and metal complex salt azo base black dyes, disazo base black dyes, azine base black dyes, phthalocyanine base black dyes and the like can be used.

Neo Super Black C-832 (trade name, manufactured by Chuo Synthetic Chemical Co., Ltd.) which is known as Solvent Black 27 can be given as the metal complex salt azo base black dyes.

Chuo Sudan Black 141 (trade name, manufactured by Chuo Synthetic Chemical Co., Ltd.) which is known as Solvent Black 3 can be given as the disazo base black dyes.

Further, Chuo Black F5 (trade name, manufactured by Chuo Synthetic Chemical Co., Ltd.) which is known as C.I. Solvent Black 7 can be given as the azine base black dyes.

Among them, the metal complex salt azo base black dyes and the disazo base black dyes are preferably used.

If carbon base pigments such as carbon black, spirit black and the like are used as the light absorber, a reduction in an insulating property of the substrate and a reduction in an insulating property between the circuits due to electric corrosion are liable to be brought about since carbon itself has an electric conductivity, and a reliability of the printed wiring board is reduced.

In contrast with this, the black dyes described above are organic dyes and do not have an electric conductivity in itself, and therefore a problem of a reliability of the printed wiring board is not caused.

The light absorber may be used alone or in combination of two or more kinds thereof.

A blending amount of the light absorber falls in a range of usually 0.01 to 2% by mass based on the thermosetting resin composition.

The blending amount is preferably 0.05 to 1.5% by mass, more preferably 0.1 to 1% by mass.

If a blending amount of the light absorber is 0.01 to 2% by mass, the optical waveguide having a high resolution can be formed, and the electric wiring pattern and the optical waveguide pattern are provided with a high visibility and are excellent in distinction of the quality of these patterns.

Even if the light absorber is blended in a large quantity exceeding 2% by mass, the effect remains unchanged.

Thermosetting resins generally used in producing laminated boards can be used as a thermosetting resin which is a base for the thermosetting resin composition, and it shall not specifically be restricted.

For example, epoxy resins, bismaleimide resins, polyimide resins, phenol resins, unsaturated polyester resins and the like can be given.

Among them, the epoxy resins are preferably used.

Compounds having two or more epoxy groups in a molecule can be used as the epoxy resin and include, for example, epoxy resins (phenol type epoxy resins) which are glycidyl ethers of phenols, such as phenol novolac type epoxy resins, cresol novolac type epoxy resins, resole novolac type epoxy resins, bisphenol A type epoxy resins and the like, alicyclic epoxy resins, epoxidated polybutadiene, glycidyl ester type epoxy resins, glycidyl amine type epoxy resins, isocyanurate type epoxy resins, flexible epoxy resins and the like.

The above multifunctional epoxy resins may be used alone or in combination of two or more kinds thereof.

When the epoxy resin is used as the thermosetting epoxy resin, a curing agent and a curing accelerator are blended therewith in order to cure the epoxy resin.

The curing agent includes novolac type phenol resins, dicyanediamide, acid anhydrides, amines and the like, and the curing accelerating agent includes imidazoles and the like.

They may be used alone or in combination of two or more kinds thereof.

The curing agent and the curing accelerating agent are blended in a range in which they are required according to an amount of the multifunctional epoxy resin used. In general, the curing agent can be used in an amount of 0.05 to 5 parts by mass, and the curing accelerating agent can be used in an amount of 0.01 to 10 parts by mass each based on 100 parts by mass of the epoxy resin.

The thermosetting resin composition of the present invention is impregnated into a fiber glass fabric in the form of a vanish and dried to prepare a pre-preg.

A solvent used to prepare the vanish shall not specifically be restricted, and publicly known solvents which can dissolve the thermosetting resin used can be used.

When the liquid thermosetting resin is used, the system can be solventless.

The solvent includes, for example, water, methanol, ethanol, propyl alcohol, butyl alcohol, acetone, methyl ethyl ketone, toluene, xylene, dioxane, N,N-dimethylformamide, ethylene glycol monomethyl ether and the like, and the above solvents may be used alone or in combination of two or more kinds thereof.

The fiber glass fabric shall not specifically be restricted, and fiber glass fabrics which are generally used in producing laminated boards can be used.

Among them, glass woven fabrics or glass nonwoven fabrics are preferably used in terms of characteristics such as a heat resistance and the like.

A process and production conditions which are used when the fiber glass fabric is impregnated with the thermosetting resin composition vanish and dried to prepare the pre-preg shall not specifically be restricted, and publicly known processes and conditions used for the thermosetting resin which is the base can be used.

It includes, for example, a process in which the fiber glass fabric is allowed to pass through a bath containing the thermosetting resin which is the base at a constant speed to be impregnated sufficiently and evenly with the thermosetting resin and in which the fiber glass fabric is then continuously heated and dried in a dryer to thereby expedite curing of the resin.

A proportion of the fiber glass fabric contained in the pre-preg is suitably determined and falls in a range of particularly preferably 35 to 70% by mass.

Further, a process and production conditions which are used when the laminated board is produced and a process and production conditions which are used when the metal-clad laminated board is subjected to circuit processing to produce the printed wiring board shall not specifically be restricted, and publicly known processes and conditions can be used.

A thickness of the pre-preg is preferably as small as 0.03 mm from the viewpoint of an appearance, and the pre-preg having a thickness of up to 0.2 mm can be used.

When the laminated board is a metal-clad laminated board, a metal foil is disposed on both surfaces or a single surface of the pre-preg laminated, and it is heated under pressure in the ranges of a temperature of 150 to 200° C. and a pressure of 1.0 to 8.0 MPa to prepare a metal-clad laminated board.

Metal foils of a single element, alloys and composite matters of copper, aluminum, brass, nickel and the like can be given as the metal foil used for the laminated board.

A process used when the metal-clad laminated board is subjected to circuit processing to produce the printed wiring board shall not specifically be restricted, and publicly known processes can be used.

A resin surface of the printed wiring board containing the inorganic filler and the light absorber which are used in the present invention has a reflectance of usually 0.2% or less in a wavelength of an exposing light used for forming the optical waveguide.

The reflectance is preferably 0.18% or less, more preferably 0.15% or less.

If a resin surface of the printed wiring board has a reflectance of 0.2% or less, the optical waveguide having a high resolution can be formed.

A reflectance of the printed wiring board in the present invention is determined by means of a HITACHI U-3310 ultraviolet-visible-light spectrophotometer equipped with a 5° specular reflectance attachment using a measuring wavelength of 365 nm which is an exposing wavelength for an optical waveguide formation.

In the hybrid optical/electrical circuit board of the present invention, the resin film for forming an optical waveguide is used for at least one of a core and a cladding layer of the optical waveguide.

That is, the optical waveguide used for the hybrid optical/electrical circuit board of the present invention is preferably prepared by using the resin film for forming an optical waveguide for at least one of the lower cladding layer, the core layer and the upper cladding layer.

Use of the resin film for forming an optical waveguide makes it possible to produce a flexible optical waveguide corresponding to an increase in the area without bringing about problems originating in that a material form thereof is liquid.

The resin film for forming an optical waveguide (hereinafter referred to as the resin film for forming a cladding layer) used for the cladding layer of the present invention is produced by using the resin for forming a cladding layer, and it is produced by applying, if necessary, the resin for forming a cladding layer on a base film.

The resin film for forming an optical waveguide (hereinafter referred to as the resin film for forming a core layer) used for the core layer of the present invention is produced by using the resin for forming a core layer, and it is produced by applying, if necessary, the resin for forming a core layer on a base film.

In the resin film for forming an optical waveguide which is used for the hybrid optical/electrical circuit board of the present invention, it is designed so that a cured resin film for forming a core layer has a higher reflectance than that of a cured resin film for forming an optical waveguide which is used for the cladding layer.

The resin for forming the cladding layer which is used for the resin film of the present invention for forming the cladding layer shall not specifically be restricted as long as a cured resin film for forming a cladding layer has a lower reflectance than that of a cured resin film for forming a core layer and it is a resin cured by light or heat, and thermosetting resins and light-sensitive resins can be used.

The resin for forming the cladding layer is constituted preferably from a resin composition comprising (A) a base polymer, (B) a photopolymerizable compound and (C) a photopolymerization initiator.

The base polymer (A) used above is used in order to form a cladding layer and ensure a strength of the above cladding layer and shall not specifically be restricted as long as an object thereof can be achieved, and it includes phenoxy resins, epoxy resins, (meth)acrylic resins, polycarbonate resins, polyallylate resins, polyetheramide, polyetherimide, polyether sulfone and derivatives thereof.

A (meth)acryl resin means an acryl resin and a methacryl resin.

The above base polymers may be used alone or in combination of two or more kinds thereof.

The base polymer (A) is preferably a resin having an aromatic skeleton in a main chain from the viewpoint of having a high heat resistance, and it is particularly preferably a phenoxy resin.

Also, from the viewpoint of capable of being three-dimensionally cross-linked and enhancing a heat resistance, epoxy resins, in particular, epoxy resins which are solid at room temperature are preferred.

Further, a compatibility of the base polymer (A) with the photopolymerizable compound (B) described later is important for ensuring a transparency of the resin film for forming the cladding layer, and from this point of view, the phenoxy resins and/or the (meth)acrylic resins are preferred.

Among the phenoxy resins described above, the resins comprising bisphenol A or a bisphenol A type epoxy compound or a derivative thereof and bisphenol F or a bisphenol F type epoxy compound or a derivative thereof as constitutional units of copolymerization components are more preferred since they are excellent in a heat resistance, a close adhesiveness and a solubility.

The derivatives of bisphenol A or the bisphenol A type epoxy compound suitably include tetrabromobisphenol A, tetrabromobisphenol A type epoxy compounds and the like.

The derivative of bisphenol F or the bisphenol F type epoxy compound suitably includes tetrabromobisphenol F, tetrabromobisphenol F type epoxy compounds and the like.

The specific example of the bisphenol A/bisphenol F copolymerization type phenoxy resin includes "Phenotohto YP-70" (trade name) manufactured by Tohto Kasei Co., Ltd.

The base polymer (A) is preferably, as described above, an epoxy resin, particularly an epoxy resin which is solid at room temperature from the viewpoints that it is three-dimensionally cross-linked and that a heat resistance is enhanced.

The epoxy resin which is solid at room temperature includes, for example, bisphenol A type epoxy resins such as "Epotohto YD-7020, Epotohto YD-7019 and Epotohto YD-7017" (trade names) manufactured by Tohto Kasei Co., Ltd. and "Epikote 1010, Epikote 1009 and Epikote 1008" (trade names) manufactured by Japan Epoxy Resins Co., Ltd.

A molecular weight of the base polymer (A) is usually 5,000 or more in terms of a number average molecular weight from the viewpoint of a film forming property.

The number average molecular weight is preferably 10,000 or more, more preferably 30,000 or more.

An upper limit of the number average molecular weight shall not specifically be restricted and is usually 1,000,000 or less from the viewpoints of a compatibility with the photopolymerizable compound (B) and the exposure developability.

An upper limit of the number average molecular weight is preferably 500,000 or less, more preferably 200,000 or less.

The number average molecular weight is a value which is measured by using gel permeation chromatography (GPC) and which is reduced to standard polystyrene.

A blending amount of the base polymer (A) is usually 10 to 80% by mass based on the total amount of the base polymer of the component (A) and the photopolymerizable compound of the component (B).

If the blending amount is 10% by mass or more, involved is the advantage that the film having a large thickness of 50 to 500 µm which is necessary for forming the optical waveguide is readily formed. On the other hand, if it is 80% by mass or less, the photocuring reaction proceeds sufficiently.

From the viewpoints described above, a blending amount of the component (A) is preferably 20 to 70% by mass, more preferably 25 to 65% by mass.

Next, the photopolymerizable compound (B) shall not specifically be restricted as long as it is polymerized by irradiation with light such as a UV ray and the like, and it includes compounds having two or more epoxy groups in a molecule and compounds having an ethylenically unsaturated group in a molecule.

The specific examples of the compounds having two or more epoxy groups in a molecule include difunctional aromatic glycidyl ethers such as bisphenol A type epoxy resins, tetrabromobisphenol A type epoxy resins, bisphenol F type epoxy resins, bisphenol AD type epoxy resins, naphthalene type epoxy resins and the like; multifunctional aromatic glycidyl ethers such as phenol novolac type epoxy resins, cresol novolac type epoxy resins, dicyclopentadiene-phenol type epoxy resins, tetraphenylolethane type epoxy resins and the like; difunctional aliphatic glycidyl ethers such as polyethylene glycol type epoxy resins, polypropylene glycol type epoxy resins, neopentyl glycol type epoxy resin, hexanediol type epoxy resins and the like; difunctional alicyclic glycidyl ethers such as hydrogenated bisphenol A type epoxy resins and the like; multifunctional aliphatic glycidyl ethers such as trimethylolpropane type epoxy resins, sorbitol type epoxy resins, glycerin type epoxy resins and the like; difunctional aromatic glycidyl esters such as diglycidyl phthalate and the like; difunctional alicyclic glycidyl esters such as diglycidyl tetrahydrophthalate, diglycidyl hexahydrophthalate and the like; difunctional aromatic glycidylamines such as N,N-diglycidylaniline, N,N-diglycidyltrifluoromethylaniline and the like; multifunctional aromatic glycidylamines such as N,N,N',N'-tetraglycidyl-4,4-diaminodiphenylmethane, 1,3-bis(N,N-glycidylaminomethyl)cyclohexane, N,N',O-triglycidyl-p-aminophenol and the like; difunctional alicyclic epoxy resins such as alicyclic diepoxy acetal, alicyclic diepoxy adipate, alicyclic diepoxy carboxylate, vinyl cyclohexene dioxide and the like; difunctional heterocyclic epoxy resins such as diglycidyl hydantoin and the like; multifunctional heterocyclic epoxy resins such as triglycidyl isocyanurate and the like; and difunctional or multifunctional silicon-containing epoxy resins such as organopolysiloxane type epoxy resins and the like.

The above compounds having two or more epoxy groups in a molecule usually have a molecular weight of 100 to 2,000, and the compounds which are liquid at room temperature are used.

The molecular weight is preferably 150 to 1,000, more preferably 200 to 800.

The above compounds may be used alone or in combination of two or more kinds thereof. Further, they can be used as well in combination with other photopolymerizable compounds.

The molecular weight thereof can be measured by using a gel permeation chromatography (GPC) method or a mass spectrometric method.

The specific examples of the compounds having an ethylenically unsaturated group in a molecule include (meth)acrylates, halogenated vinylidene, vinyl ether, vinylpyridine, vinylphenol and the like. Among them, the (meth)acrylates are preferred from the viewpoints of a transparency and a heat resistance, and any of monofunctional, difunctional and trifunctional or higher (meth)acrylates can be used.

The monofunctional (meth)acrylate includes methoxypolyethylene glycol (meth)acrylate, phenoxypolyethylene glycol (meth)acrylate, lauryl (meth)acrylate, isostearyl (meth)acrylate, 2-(meth)acryloyloxyethyl succinate, paracumylphenoxyethylene glycol (meth)acrylate, 2-tetrahydropyranyl (meth)acrylate, isobornyl (meth)acrylate, methyl (meth)acrylate, ethyl (meth)acrylate, butyl (meth)acrylate, benzyl (meth)acrylate and the like.

Also, the difunctional (meth)acrylate includes ethoxylated 2-methyl-1,3-propanediol di(meth)acrylate, neopentyl glycol di(meth)acrylate, 1,6-hexanediol di(meth)acrylate, 2-methyl-1,8-octanediol di(meth)acrylate, 1,9-nonanediol di(meth)acrylate, 1,10-nonanediol di(meth)acrylate, ethoxylated polypropylene glycol di(meth)acrylate, propoxylated ethoxylated bisphenol A diacrylate, ethylene glycol di(meth)acrylate, triethylene glycol di(meth)acrylate, tetraethylene glycol di(meth)acrylate, polyethylene glycol di(meth)acrylate, polypropylene glycol di(meth)acrylate, ethoxylated bisphenol A di(meth)acrylate, tricyclodecane di(meth)acrylate, ethoxylated cyclohexanedimethanol di(meth)acrylate, 2-hydroxy-1-acryloxy-3-methacryloxypropane, 2-hydroxy-1,3-dimethacryloxypropane, 9,9-bis[4-[(2-acryloyloxy-ethoxy)phenyl]fluorene, 9,9-bis(3-phenyl-4-acryloylpolyoxyethoxy)fluorene, epoxy (meth)acrylates of a bisphenol A type, a phenol novolac type, a cresol novolac type and a glycidyl ether type and the like.

Further, the trifunctional or higher (meth)acrylate includes ethoxylated isocyanuric acid tri(meth)acrylate, ethoxylated glycerin tri(meth)acrylate, trimethylolpropane tri(meth)acrylate, ethoxylated trimethylolpropane tri(meth)acrylate, pentaerythritol tri(meth)acrylate, pentaerythritol tetra(meth)acrylate, ethoxylated pentaerythritol tetra(meth)acrylate, propoxylated pentaerythritol tetra(meth)acrylate, ditrimethylolpropane tetra(meth)acrylate, caprolactone-modified ditrimethylolpropane tetra(meth)acrylate, dipentaerythritol hexa(meth)acrylate and the like.

They may be used alone or in combination of two or more kind thereof.

In this connection, (meth)acrylate means acrylate and methacrylate.

A blending amount of the photopolymerizable compound (B) is usually 20 to 90% by mass based on the total amount of the base polymer of the component (A) and the photopolymerizable compound of the component (B).

If the blending amount is 20% by mass or more, the base polymer can readily be introduced into the photopolymerizable compound and cured. On the other hand, if it is 90% by mass or less, the cladding layer having a sufficiently large thickness can readily be formed.

From the viewpoints described above, a blending amount of the component (B) is preferably 25 to 85% by mass, more preferably 30 to 80% by mass.

Next, the photopolymerization initiator of the component (C) shall not specifically be restricted, and the initiator for the epoxy compound includes, for example, aryldiazonium salts such as p-methoxybenzenediazonium hexafluorophosphate and the like; diaryliodonium salts such as diphenyliodonium hexafluorophosphonium salt, diphenyliodonium hexafluoroantimonate salt and the like; triarylsulfonium salts such as triphenylsulfonium hexafluorophosphonium salt, triphenylsulfonium hexafluoroantimonate salt, diphenyl-4-thiophenoxyphenylsulfonium hexafluoroantimonate salt, diphenyl-4-thiophenoxyphenylsulfonium pentafluorohydroxyantimonate salt and the like; triallylselenonium salts such as triphenylselenonium hexafluorophosphonium salt, triphenylselenonium borofluoride salt, triphenylselenonium hexafluoroantimonate salt and the like; dialkylphenacylsulfonium salts such as dimethylphenacylsulfonium hexafluoroantimonate salt, diethylphenacylsulfonium hexafluoroantimonate salt and the like; dialkyl-4-hydroxyphenylsulfonium salts such as 4-hydroxyphenyldimethylsulfonium hexafluoroantimonate salt, 4-hydroxyphenylbenzylmethylsulfonium hexafluoroantimonate salt and the like; and sulfonic acid esters such as α-hydroxymethylbenzoinsulfonates, N-hydroxyimidosulfonates, α-sulfonyloxyketone, β-sulfonyloxyketone and the like.

Further, the initiator for the compounds having an ethylenically unsaturated group in a molecule includes aromatic ketones such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzyl-2-dimethylamino-1-(4-morpholinophenyl)-butane-1-one, 2,2-dimethoxy-1,2-diphenylethane-1-one, 1-hydroxycyclohexyl phenyl ketone, 2-hydroxy-2-methyl-1-phenylpropane-1-one, 1-[4-(2-hydroxyethoxy)phenyl]-2-hydroxy-2-methyl-1-propane-1-one, 1,2-methyl-1-[4-(methylthio)phenyl]-2-morpholinopropane-1-one and the like; quinones such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, 2,3-dimethylanthraquinone and the like; benzoin ether compounds such as benzoin methyl ether, benzoin ethyl ether, benzoin phenyl ether and the like; benzoin compounds such as benzoin, methylbenzoin, ethylbenzoin and the like; benzyl derivatives such as benzyl dimethyl ketal and the like; 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer and the like; phosphine oxides such as bis(2,4,6-trimethylbenzoyl)phenylphosphine oxide, bis(2,6-dimethoxybenzoyl)-2,4,4-trimethylpentylphosphine oxide, 2,4,6-trimethylbenzoyldiphenylphosphine oxide and the like; acridine derivatives such as 9-phenylacridine, 1,7-bis(9,9'-acridinyl)heptane and the like; N-phenylglycine; N-phenylglycine derivatives; coumarin compounds and the like.

Further, when the aryl groups are substituted in the 2,4,5-triarylimidazole dimer, two aryl groups may have the same substituent to provide the symmetric dimer or may have different substituents to provide the asymmetric dimer.

As is the case with combination of diethylthioxanthone and dimethylaminobenzoic acid, thioxanthone base compounds and tertiary amine compounds may be combined.

Among the photopolymerization initiators described above, the aromatic ketones and the phosphine oxides are preferred from the viewpoint of enhancing a transparency of the core layer and the cladding layer.

The above photopolymerization initiators (C) may be used alone or in combination of two or more kinds thereof.

A blending amount of the photopolymerization initiator (C) is usually 0.1 to 10 parts by mass per 100 parts by mass of the total amount of the base polymer of the component (A) and the photopolymerizable compound of the component (B).

If it is 0.1 part by mass or more, the photosensitivity is sufficiently high. On the other hand, if it is 10 parts by mass or less, the optical waveguide is prevented from being selectively cured only on a surface and insufficiently cured in a whole part. Further, the propagation loss is prevented from being increased by light absorption by the photopolymerization initiator itself.

From the viewpoints described above, a blending amount of the component (C) is preferably 0.5 to 5 parts by mass, more preferably 1 to 4 parts by mass.

In addition to the above components, so-called additives such as antioxidants, yellowing inhibitors, UV absorbers, visible light absorbers, coloring agents, plasticizers, stabilizers, fillers and the like may be added, if necessary, to the resin of the present invention in for forming a cladding layer in a proportion in which an adverse influence is not exerted on the effects of the present invention.

The resin for forming a cladding layer can used as well in the form of a resin vanish for forming a cladding layer which is prepared by dissolving the resin composition comprising the base polymer (A), the photopolymerizable compound (B) and the photopolymerization initiator (C) in a solvent.

The resin film for forming a cladding layer can readily be produced by applying the resin vanish for forming a cladding layer, if necessary, on a base film and removing the solvent.

The base film used, if necessary, in a production step for the resin film for forming a cladding layer is a support for supporting the film for forming an optical waveguide, and a material therefor shall not specifically be restricted. For example, polyesters such as polyethylene terephthalate (PET) and the like, polypropylene and polyethylene are suitably used from the viewpoints that the resin film for forming a cladding layer is readily peeled off from them and that they have a heat resistance and a solvent resistance.

The base films described above may be subjected to mold releasing treatment, antistatic treatment and the like in order to make it easy to peel the resin film for forming a cladding layer in a subsequent step.

The base film has a thickness of usually 5 to 50 μm.

If a thickness of the base film is 5 μm or more, there is the advantage that a strength of the support is liable to be obtained, and if it is 50 μm or less, there is the advantage that the winding property in producing the resin film in a roll form is enhanced.

From the viewpoints described above, a thickness of the base film is preferably 10 to 40 μm, more preferably 15 to 30 μm.

Further, a protective film may be stuck on the resin film for forming a cladding layer considering protection of the film and the winding property in producing the resin film in a roll form.

The same ones as those given as the examples of the base films described above can be used as the protective film and may be subjected, if necessary, to mold releasing treatment and antistatic treatment.

The solvent used for the resin vanish for forming a cladding layer shall not specifically be restricted as long as it can dissolve the resin composition comprising the components (A) to (C), and capable of being used are, for example, solvents such as acetone, methyl ethyl ketone, methyl cellosolve, ethyl cellosolve, toluene, N,N-dimethylacetamide, propylene glycol monomethyl ether, propylene glycol monomethyl ether acetate, cyclohexanone, N-methyl-2-pyrrolidone and the like and mixed solvents thereof.

A concentration of solid matters contained in the resin vanish for forming a cladding layer is usually 30 to 80% by mass, preferably 35 to 75% by mass and more preferably 40 to 70% by mass.

A thickness of the resin film for forming a cladding layer shall not specifically be restricted, and it is controlled so that a thickness of the cladding layer after dried is usually 5 to 500 μm.

If a thickness of the cladding layer is 5 μm or more, a cladding layer thickness required for shutting light up can be secured, and if the thickness is 500 μm or more, it is easy to evenly control a film thickness of the cladding layer.

From the viewpoints described above, a thickness of the cladding layer is preferably 10 to 100 μm, more preferably 20 to 90 μm.

A thickness of the cladding layer may be the same or different in the lower cladding layer which is first formed and the upper cladding layer for embedding the core pattern, and a thickness of the upper cladding layer is preferably larger than a thickness of the core layer in order to embed the core pattern.

Further, the cladding layer can readily be produced as well by applying the resin vanish for forming a cladding layer on the printed wiring board by a spin coating method and the like and removing the solvent.

Next, the resin film for forming a core layer which is used in the present invention is designed so that the core layer has a higher refractive index than that of the cladding layer. A resin composition which can form a core pattern by an actinic ray such as a UV ray and the like can be used, and a light-sensitive resin composition is suited.

To be specific, the same resin composition as used in the resin for forming a cladding layer described above is preferably used.

That is, it is a resin composition which contains the base polymer (A), the photopolymerizable compound (B) and the photopolymerization initiator (C) each described above and which contains, if necessary, the optional components described above.

The resin for forming a core layer can used as well in the form of a resin vanish for forming a core layer which is prepared by dissolving the resin composition comprising the base polymer (A), the photopolymerizable compound (B) and the photopolymerization initiator (C) in a solvent.

The resin film for forming a core layer can readily be produced by applying the resin vanish for forming a core layer, if necessary, on a base film and removing the solvent.

The base film used, if necessary, in a production step for the resin film for forming a core layer is a support for supporting the film for forming an optical waveguide. A material therefor shall not specifically be restricted, and the same base film as used in the production step for the resin film for forming a cladding layer can be used.

For example, polyesters such as polyethylene terephthalate (PET) and the like, polypropylene and polyethylene can suitably be used from the viewpoints that the resin film for forming a core layer is readily peeled off from them and that they have a heat resistance and a solvent resistance.

A flexible base film of a high transparent type is preferably used in order to enhance a transmittance of a ray for exposure and reduce roughening of a side wall of the core pattern.

A haze value of the base film of a high transparent type is usually 5% or less, preferably 3% or less and more preferably 2% or less.

Trade names "COSMO SHINE A1517" and "COSMO SHINE A4100" manufactured by Toyobo Co., Ltd. are available as the above base film.

The base films described above may be subjected to mold releasing treatment, antistatic treatment and the like in order to make it easy to peel the resin film for forming a core layer in a subsequent step.

The base film has a thickness of usually 5 to 50 μm.

If a thickness of the base film is 5 μm or more, there is the advantage that a strength of the support is liable to be obtained, and if it is 50 μm or less, there are the advantages that a gap to the mask in forming the core pattern is reduced and that finer patters can be formed.

From the viewpoints described above, a thickness of the base film is preferably 10 to 40 μm, more preferably 15 to 30 μm.

In this case, a protective film may be stuck, if necessary, on the resin film for forming a core layer for the purposes of protection of the film and the winding property in producing the resin film in a roll form.

The same base film as used in the resin film for forming a cladding layer can be used as the protective film, and it may be subjected, if necessary, to mold releasing treatment and antistatic treatment.

The solvent used for the resin vanish for forming a core layer shall not specifically be restricted as long as it can dissolve the resin composition comprising the components (A) to (C), and capable of being used are, for example, solvents such as acetone, methyl ethyl ketone, methyl cellosolve, ethyl cellosolve, toluene, N,N-dimethylacetamide, propylene glycol monomethyl ether, propylene glycol monomethyl ether acetate, cyclohexanone, N-methyl-2-pyrrolidone and the like and mixed solvents thereof.

A concentration of solid matters contained in the resin vanish for forming a core layer is usually 30 to 80% by mass, preferably 35 to 75% by mass and more preferably 40 to 70% by mass.

A thickness of the resin film for forming a core layer shall not specifically be restricted, and it is controlled so that a thickness of the core layer after dried is usually 10 to 100 μm.

If a thickness of the core layer is 10 μm or more, provided is the advantage that a positioning tolerance can be expanded in connection with light-sensitive and light emitting devices or an optical fiber after forming the optical waveguide. If it is 100 μm or less, provided is the advantage that a connection efficiency is enhanced in connection with light-sensitive and light emitting devices or an optical fiber after forming the optical waveguide.

From the viewpoints described above, a thickness of the core layer is preferably 29 to 90 μm, more preferably 30 to 80 μm.

Further, the core layer can readily be produced as well by applying the resin vanish for forming a core layer on the cladding layer by a spin coating method and the like and removing the solvent.

One example of a production process for the hybrid optical/electrical circuit board of the present invention shall be explained below.

FIG. 1 is an explanatory drawing showing one example of the production process for the hybrid optical/electrical circuit board of the present invention.

First, in a first step (refer to FIG. 1(a)), a resin film for forming a first cladding layer which is formed on a base film is laminated on a printed wiring board 2, and then it is cured by light or heat to form a cladding layer 1.

In the above first step, the resin film for forming a cladding layer is heated and compressed onto the printed wiring board 2 described above to thereby laminate a cladding layer 1.

In this regard, it is laminated preferably under reduced pressure from the viewpoints of the close adhesiveness and the followability.

A heating temperature in the lamination is preferably 50 to 130° C., and a compression pressure is preferably 0.1 to 1.0 MPa (1 to 10 kgf/cm²). However, the above conditions shall not specifically be restricted.

In a case where a protective film 8 is provided on a side reverse to the base film 4 in the above resin film for forming a cladding layer (refer to FIG. 2), the above protective film 8 is peeled off, and then the resin film 9 for forming a cladding layer is heated and compressed onto a printed wiring board 2 and cured by light or heat to form a cladding layer 1.

In this case, the protective film 8 and the base film 4 are not subjected preferably to adhesion treatment in order to make it easy to peel them from the resin film 9 for forming a cladding layer, and they may be subjected, if necessary, to mold releasing treatment (refer to a and b in FIG. 2).

A resin vanish for forming a cladding layer may be applied on the printed wiring board 2 by a spin coating method and the like and cured by light or heat after removing the solvent to form the cladding layer 1.

Next, in a second step (refer to FIG. 1(b)), a resin film for forming a core layer is laminated on the cladding layer 1 to laminate a core layer 3.

In the above second step, when the base film 4 is present on the cladding layer 1 described above, it is peeled off, and then the resin film for forming a core layer is heated and compressed to thereby laminate the core layer 3 having a higher refractive index than that of the cladding layer 1.

In this regard, it is laminated preferably under reduced pressure from the viewpoints of the close adhesiveness and the followability.

A heating temperature in the lamination is preferably 50 to 130° C., and a compression pressure is preferably 0.1 to 1.0 MPa (1 to 10 kgf/cm²). However, the above conditions shall not specifically be restricted.

When the resin film for forming a core layer is constituted from the core layer 3 and the base film 4, it is easily handled and preferred, but it may be constituted from the core layer 3 alone.

The core layer 3 may be formed as well by applying the resin vanish for forming a core layer on the cladding layer 1 by a spin coating method and the like and removing the solvent.

In a case where a protective film 8 is provided on a side reverse to the base film 4 in the resin film for forming a core layer (refer to FIG. 3), the above protective film 8 is peeled off, and then the resin film 10 for forming a core layer is laminated.

In this case, the protective film 8 and the base film 4 are not subjected preferably to adhesion treatment in order to make it easy to peel them from the resin film 10 for forming a core layer, and they may be subjected, if necessary, to mold releasing treatment (refer to c and d in FIG. 3).

Next, in a third step and a fourth step (refer to FIGS. 1(c) and (d)), the core layer 3 is exposed and developed to form an optical waveguide core pattern 6.

To be specific, an actinic ray such as a UV ray and the like is imagewise irradiated through a photomask pattern.

A light source for the actinic ray includes, for example, publicly known light sources which effectively radiate a UV ray, such as a carbon arc lamp, a mercury vapor arc lamp, a ultrahigh pressure mercury lamp, a high pressure mercury lamp, a xenon lamp and the like.

In addition thereto, lamps which effectively radiate a visible light, such as a photographic flood bulb, a solar lamp and the like can be used as well.

Next, when the base film 4 remains on the core layer 3, the base film 4 is peeled off, and unexposed parts are removed by wet development to carry out development, whereby the optical waveguide core pattern 6 is formed.

In the case of the wet development, an organic solvent base developer which is suited to the compositions of the resin film for forming a core layer and the resin vanish for forming a core layer is used to carry out development by publicly known methods such as spray, vibration dipping, brushing, scrapping and the like.

The organic solvent base developer includes, for example, N-methylpyrrolidone, N,N-dimethylformamide, N,N-dimethylacetamide, cyclohexanone, methyl ethyl ketone, methyl isobutyl ketone, γ-butyrolactone, methyl cellosolve, ethyl cellosolve, propylene glycol monomethyl ether, propylene glycol monomethyl ether acetate and the like.

Water may be added to the above organic solvents in a range of usually 1 to 20 parts by mass based on 100 parts by mass of the organic solvent in order to prevent flashing.

Further, two or more kinds of developing methods may be used, if necessary, in combination.

The developing method includes, for example, a dipping method, a paddle method, a spray method such as a high pressure spray method and the like, brushing, scrapping and the like, and the high pressure spray method is the most suitable for enhancing the resolution.

Heating at 60 to 250° C. or exposure of 0.1 to 1000 mJ/cm$^2$ may be carried out, if necessary, as treatment after development to thereby cure furthermore the optical waveguide core pattern 6.

Thereafter, in a fifth step (refer to FIG. 1(*e*)), carried out are a step in which a resin film for forming a cladding layer for embedding the core pattern 6 is laminated and a step in which a resin for forming a cladding layer in the above resin film for forming a cladding layer is cured to cure a cladding layer 7.

The resin film for forming a cladding layer is laminated on a core pattern 6 side when the resin film for forming a cladding layer is prepared on the base film 4.

In this case, a thickness of the cladding layer 7 is, as described above, preferably larger than a thickness of the core layer 3.

Curing is carried out by light or heat in the same manner as described above.

In a case where the protective film 8 is provided on a side reverse to the base film 4 in the resin film for forming a cladding layer (refer to FIG. 2), the above protective film 8 is peeled off, and then the resin film 9 for forming a cladding layer is heated and compressed and cured by light or heat to form the cladding layer 7.

In this case, the base film may be peeled off or, if necessary, left stuck.

When it is left stuck, a film of the resin for forming a cladding layer is produced on the base film 4 subjected to adhesion treatment.

On the other hand, the protective film 8 is not subjected preferably to adhesion treatment in order to make it easy to peel the protective film from the resin film 9 for forming a cladding layer, and it may be subjected, if necessary, to mold releasing treatment (refer to a and b in FIG. 2).

The cladding layer 7 may be formed as well by applying the resin vanish for forming a cladding layer by a spin coating method and the like and curing it by light or heat after removing the solvent to.

EXAMPLES

The present invention shall be explained below in further details with reference to examples, but the present invention shall by no means be restricted by these examples.

Example 1

Preparation of Printed Wiring Board

A glass flask equipped with a stirring device, a condenser and a thermometer was charged with 40 g of tetramethoxysilane and 93 g of methanol and then charged with 0.47 g of acetic acid and 18.9 g of distilled water, and then the solution was stirred at 50° C. for 8 hours to synthesize a silicone polymer.

An average value of a repetitive unit in the silicone polymer obtained above was 20.

Methyl ethyl ketone was added to the above silicone polymer solution to prepare a treating liquid having a solid content of 10% by mass.

The above treating liquid was blended with 1300 g of silica as an inorganic filler and stirred at room temperature for one hour to prepare the treating liquid containing the filler.

The treating liquid containing the filler thus obtained was heated at 50° C., and resins and a compound in blending amounts shown in (1) to (5) described below based on 180 parts by mass of the inorganic filler contained in the above liquid and a mixed solution of methyl ethyl ketone and methylene glycol monomethyl ether of a mass ratio 50:50 were added thereto to prepare a resin vanish having a solid content of 70% by mass.

In this regard, a proportion of the inorganic filler based on the total amount of solid matters contained in the resin vanish was about 41% by volume.

(1) Brominated bisphenol A type epoxy resin: 50 parts by mass (ESB400T, epoxy equivalent: 400, manufactured by Sumitomo Chemical Co., Ltd.)

(2) Ortho cresol novolac type epoxy resin: 50 parts by mass (ESCN195, epoxy equivalent: 195, manufactured by Sumitomo Chemical Co., Ltd.)

(3) Phenol novolac epoxy resin: 42 parts by mass (HP850N, hydroxyl equivalent: 108, manufactured by Hitachi Chemical Co., Ltd.)

(4) 2-ethyl-4-methylimidazole: 0.5 part by mass (5) Disazo base dye (black dye): 0.5 part by mass (Chuo Sudan Black 141, manufactured by Chuo Synthetic Chemical Co., Ltd.)

A glass cloth (Style 2116, E-glass, manufactured by Nittobo Co., Ltd.) having a thickness of about 0.1 mm was impregnated with the resin vanish described above and then heated and dried at 150° C. for 5 minutes to obtain a pre-preg having a resin content of 43% by mass.

Four sheets of the above pre-pregs were superposed, and copper foils having a thickness of 18 μm were superposed on both sides thereof to prepare a both side copper-clad laminated board at the press conditions of 170° C., 90 minutes and 4.0 MPa.

The both side copper-clad laminated board described above was subjected to etching to form a circuit, whereby a printed wiring board 2 was prepared.

Preparation of Hybrid Optical/Electrical Circuit Board:

Next, a resin composition for forming a core layer and a resin composition for forming a cladding layer each having blending amounts shown in Table 1 were prepared, and methyl ethyl ketone as a solvent was added to them in an amount of 40 parts by mass based on the whole amount of the composition to prepare resin vanishes for a core and a cladding.

In Table 1, the blending amounts of the base polymer (A) and the photopolymerizable compound (B) are shown by mass % based on the total amount of the component (A) and the component (B), and a blending amount of the photopolymerization initiator (C) is shown by a proportion (parts by mass) based on the total amount 100 parts by mass of the component (A) and the component (B).

TABLE 1

| Resin composition | Base polymer (A) | Photo-polymerizable compound (B) | Photo-polymerization initiator (C) |
|---|---|---|---|
| For core | Phenotohto YP-70*[1] (20% by mass) | A-BPEF*[2] (39.8% by mass) EA-1020*[3] (39.8% by mass) | Irgacure 819*[5] (1 part by mass) Irgacure 2959*[6] (1 part by mass) |
| For cladding | Phenotohto YP-70*[1] (35.7% by mass) | KRM-2110*[4] (64.3% by mass) | SP-170*[7] (2 parts by mass) |

*[1]Phenotohto YP-70; bisphenol A/bisphenol F copolymerization type phenoxy resin (manufactured by Tohto Kasei Co., Ltd.)
*[2]A-BPEF; 9,9-bis[4-(2-acryloyloxyethoxy)phenyl]fluorene bisphenol A type epoxy acrylate (manufactured by Shin-Nakamura Chemical Co., Ltd.)
*[3]EA-1020; bisphenol A type epoxy acrylate (manufactured by Shin-Nakamura Chemical Co., Ltd.)
*[4]KRM-2110; alicyclic diepoxy carboxylate (manufactured by Asahi Denka Co., Ltd.)
*[5]Irgacure 819; bis(2,4,6-trimethylbenzoyl)phenylphosphine oxide (manufactured by Ciba Specialty Chemicals K.K.)
*[6]Irgacure 2959; 1-[4-(2-hydroxyethoxy)phenyl]-2-hydroxy-2-methyl-1-propane-1-one (manufactured by Ciba Specialty Chemicals K.K.)
*[7]SP-170; triphenylphosphonium hexafluoroantimonate salt (manufactured by Asahi Denka Co., Ltd.)

A resin film for forming an upper and lower cladding layer was obtained by applying the resin vanish for a cladding described above on a polyethylene terephthalate (PET) film (trade name "COSMO SHINE A-4100", thickness: 50 μm, coated surface: non-treated surface, manufactured by Toyobo Co., Ltd.) which was a base material (support) film 4 by means of a coating machine (Multicoater M-200, manufactured by Hirano Tecseed Co., Ltd.) and drying it at 80° C. for 10 minutes and then at 100° C. for 10 minutes.

In this case, a thickness of the resin film for forming a cladding can arbitrarily be controlled by adjusting a gap of the coating machine, and in the present example, the gap was controlled so that the film thickness after cured was 30 μm in the lower cladding layer and 80 μm in the upper cladding layer.

A resin film for forming a core layer was obtained by applying the resin vanish for a core described above on the polyethylene terephthalate (PET) film (trade name "COSMO SHINE A-4100", thickness: 50 μm, coated surface: non-treated surface, manufactured by Toyobo Co., Ltd.) which was a base material (support) film 4 by means of the coating machine (Multicoater M-200, manufactured by Hirano Tecseed Co., Ltd.) and drying it at 80° C. for 10 minutes and then at 100° C. for 10 minutes.

In this case, a thickness of the resin film for forming a core can arbitrarily be controlled by adjusting a gap of the coating machine, and in the present example, the gap was controlled so that the film thickness after cured was 50 μm.

A refractive index of the resin film for forming an optical waveguide (the resin film for forming a core layer and the resin film for forming a cladding layer) after cured in the present example was measured (measuring wavelength: 830 nm) by means of a prism coupler (Model 2020, manufactured by Metricon Co., Ltd.) to find that a refractive index of the resin film for forming a core layer was 1.583 and that a refractive index of the resin film for forming a cladding layer was 1.550.

The resin film for forming a cladding layer (the resin film for forming a lower cladding layer) described above was laminated on a printed wiring board 2 on the conditions of a pressure of 0.5 MPa, a temperature of 60° C. and a pressing time of 30 seconds by means of a vacuum pressing type laminator (MVLP-600, manufactured by Meiki Co., Ltd.), and this was irradiated with a UV ray (wavelength: 365 nm) at 1000 mJ/cm² by means of a UV ray exposing device (EXM-1172, manufactured by Orc Manufacturing Co., Ltd.) to optically cure the laminated resin film for forming a lower cladding layer, whereby a lower cladding layer 1 was formed (refer to FIG. 1(a)).

Next, the polyethylene terephthalate film which was the base film on the lower cladding layer 1 was peeled off, and the resin film for forming a core layer described above was laminated on the above lower cladding layer 1 in the same manner (refer to FIG. 1(b)).

Subsequently, the resin film was irradiated with a UV ray (wavelength: 365 nm) at 500 mJ/cm² via a negative type photomask 5 having a pattern of a line width/line space=50/75 μm by means of the UV ray exposing device described above (refer to FIG. 1(c)), and then the PET film which was the base film 4 was peeled off, followed by developing the core pattern 6 by using a developer (ethyl cellosolve/N,N-dimethylacetamide=8/2 (mass ratio) mixed solution) (refer to FIG. 1(d)).

Then, the resin film for forming a cladding described above was laminated in the same manner as in the lower cladding layer 1, and it was irradiated with a UV ray and subjected to heat treatment at 160° C. for 60 minutes, whereby an upper cladding layer 7 was formed (refer to FIG. 1(e)) to obtain a hybrid optical/electrical circuit board having a pattern of a line width/line space=50/75 μm.

The hybrid optical/electrical circuit board thus obtained had an appearance in which a basic tone was a black color and was excellent in a visibility of the electric wiring pattern and the core pattern of the optical waveguide.

A reflectance on a surface of the printed wiring board was measured by means of a HITACHI U-3310 ultraviolet-visiblelight spectrophotometer equipped with a 5° specular reflectance attachment. The measurement was carried out at a wavelength of 365 nm which was a wavelength of an exposing light for an optical waveguide fabrication.

Also, a propagation loss of the optical waveguide fabricated in the manner described above was measured by a cutback method using VCSEL (FLS-300-01-VCL, manufactured by Electro-Optical Engineering Inc.) of 850 nm as a light source to find that it was 0.1 dB/cm.

Further, the above optical waveguide was examined on a soldering reflow with the condition of a highest temperature at 265° C. (holding time at 260° C. or higher: 20 seconds) under nitrogen atmosphere. After three times reflow soldering test, loss increase was 0.02 dB/cm. It was sufficiently small. The results thereof are shown in Table 2.

Comparative Example 1

A hybrid optical/electrical circuit board was prepared in the same way as in Example 1, except that in preparing the printed wiring board in Example 1, a resin composition vanish which was not blended with the disazo base dye was used.

In this case, an optical waveguide having a pattern of a line width/line space=50/75 μm could not be formed. The results thereof are shown in Table 2.

Comparative Example 2

A hybrid optical/electrical circuit board was prepared in the same manner as in Example 1, except that in preparing the printed wiring board in Example 1, the disazo base dye was not blended and that a proportion of the inorganic filler based on the total amount of the resin composition solid matters was changed to 15% by volume.

In this case, an optical waveguide having a pattern of a line width/line space=50/75 μm could not be formed. The results thereof are shown in Table 2.

TABLE 2

|  | Example | Comparative Example | |
| --- | --- | --- | --- |
| Items | 1 | 1 | 2 |
| Inorganic filler content (% by volume) | 41 | 41 | 15 |
| Black dye | Added | None | None |
| Reflectance (%)[*1] | 0.2 | 0.3 | 0.3 |
| Formation of optical waveguide having a pitch of 125 μm (line width 50 μm/line space 75 μm) | Yes | No | No |
| Propagation loss of optical waveguide (dB/cm) | 0.1 | — | — |
| Increase in loss caused by reflow soldering test (dB/cm) | 0.02 | — | — |

*measured wavelength: 365 nm

Example 2

Preparation of Printed Wiring Board

A printed wiring board 3 was prepared in the same manner as in Example 1.
Preparation of Resin Film for Forming a Cladding Layer:

A phenoxy resin (trade name: Phenotohto YP-70, manufactured by Tohto Kasei Co., Ltd.) 50% by mass as the base polymer (A), alicyclic diepoxy carboxylate (trade name: KRM-2110, molecular weight: 252, manufactured by Asahi Denka Co., Ltd.) 50% by mass as the photopolymerizable compound (B), triphenylsulfonium hexafluoroantimonate salt (trade name: SP-170, manufactured by Asahi Denka Co., Ltd.) 2 parts by mass as the photopolymerization initiator (C) and propylene glycol monomethyl ether acetate 40 parts by mass as an organic solvent were weighed into a wide mouth plastic bottle and stirred for 6 hours on the conditions of a temperature of 25° C. and a revolution of 400 rpm by means of a mechanical stirrer, a shaft and a propeller to prepare a resin vanish A for forming a cladding layer.

Then, a polyflon filter (trade name: PF020, manufactured by Advantec MFS, Inc.) having a pore diameter of 2 μm was used to filtrate the resin vanish under applied pressure on the conditions of a temperature of 25° C. and a pressure of 0.4 MPa, and the resin vanish was further defoamed under reduced pressure for 15 minutes on the condition of a decompression degree of 50 mm Hg by means of a vacuum pump and a bell jar.

The blending amounts of the base polymer (A) and the photopolymerizable compound (B) are shown by mass % based on the total amount of the component (A) and the component (B), and the blending amounts of the photopolymerization initiator (C) and the organic solvent are shown by a proportion (parts by mass) based on the total amount 100 parts by mass of the component (A) and the component (B).

The resin vanish for forming a cladding layer obtained above was applied on a polyethylene terephthalate (PET) film (trade name "COSMO SHINE A-4100", thickness: 50 μm, coated surface: non-treated surface, manufactured by Toyobo Co., Ltd.) which was used as a base film by means of a coating machine (Multicoater M-200, manufactured by Hirano Tecseed Co., Ltd.) and dried at 80° C. for 10 minutes and then at 100° C. for 10 minutes, and thereafter a mold releasing PET film (trade name: A31, thickness: 25 μm, manufactured by Teijin DuPont Films Japan Ltd.) as a protective film was stuck thereon so that a mold releasing face thereof was opposed to a resin side to obtain a resin film for forming a cladding layer.

In this case, a thickness of the resin layer can arbitrarily be controlled by adjusting a gap of the coating machine, and in the present example, the gap was controlled so that the film thickness after cured was 30 μm in the lower cladding layer and 80 μm in the upper cladding layer.
Preparation of Resin Film for Forming a Core Layer:

A resin vanish for forming a core layer was prepared according to the same method and conditions as in the production example described above, except that used were a phenoxy resin (trade name: Phenotohto YP-70, manufactured by Tohto Kasei Co., Ltd.) 26% by mass as the base polymer (A), 9,9-bis[4-(2-acryloyloxyethoxy]phenyl]fluorene (trade name: A-BPEF, manufactured by Shin-Nakamura Chemical Co., Ltd.) 37% by mass, bisphenol A type epoxy acrylate (trade name: EA-1020, manufactured by Shin-Nakamura Chemical Co., Ltd.) 37% by mass as the photopolymerizable compound (B), bis(2,4,6-trimethylbenzoyl)phenylphosphine oxide (trade name: Irgacure 819, manufactured by Ciba Specialty Chemicals K.K.) 1 part by mass as the photopolymerization initiator (C) and propylene glycol monomethyl ether acetate 40 parts by mass as an organic solvent.

Then, the resin vanish was filtrated and further defoamed according to the same method and conditions as in the production example described above.

The blending amounts of the base polymer (A) and the photopolymerizable compound (B) are shown by mass % based on the total amount of the component (A) and the component (B), and the blending amounts of the photopolymerization initiator (C) and the organic solvent are shown by a proportion (parts by mass) based on the total amount 100 parts by mass of the component (A) and the component (B).

The resin vanish for forming a core layer obtained above was applied on a non-treated surface of a polyethylene terephthalate (PET) film (trade name COSMO SHINE A1517, thickness: 16 μm, manufactured by Toyobo Co., Ltd.) which was used a base film and dried by the same methods as in the production example described above, and thereafter a mold releasing PET film (trade name: A31, thickness: 25 μm, manufactured by Teijin DuPont Films Japan Ltd.) as a protective film was stuck thereon so that a mold releasing surface thereof was opposed to a resin side to obtain a resin film for forming a core layer.

In the present example, the gap of the coating machine was controlled so that the film thickness after cured was 50 μm.
Preparation of Hybrid Optical/Electrical Circuit Board:

The mold releasing PET film (A31) which was the protective film for the resin film for forming a lower cladding layer obtained in the production example described above was peeled off, and the resin film for forming a cladding layer (resin film for forming a lower cladding layer) described above was laminated on a printed wiring board 3 on the conditions of a pressure of 0.5 MPa, a temperature of 60° C. and a pressing time of 30 seconds by means of a vacuum pressing type laminator (MVLP-500, manufactured by Meiki Co., Ltd.). This was irradiated with a UV ray (wavelength: 365 nm) at 1000 mJ/cm$^2$ by means of a UV ray exposing device (MAP-1200-L, manufactured by Dainippon Screen Mfg. Co., Ltd.) to optically cure the laminated resin film for forming a lower cladding layer.

Further, the base film was peeled off, and then the resin film was subjected to heat treatment at 80° C. for 10 minutes to thereby form a lower cladding layer 1 (refer to FIG. 1(a)).

Next, the resin for forming a core layer obtained in the production example described above was laminated on the above lower cladding layer 1 on the conditions of a pressure of 0.4 MPa, a temperature of 50° C. and a laminating speed of 0.2 m/minute by means of a roll laminator (HLM-1500, manufactured by Hitachi Plant Techno Co., Ltd.) after peeling the mold releasing PET film (A31) which was the protective film, and then after vacuuming at 500 MPa or lower, a core layer was formed by heating and compressing the resin on the conditions of a pressure of 0.5 MPa, a temperature of 60° C. and a pressing time of 30 seconds by means of the vacuum pressing type laminator (MVLP-500, manufactured by Meiki Co., Ltd.) as a flat plate type laminator (refer to FIG. 1(b)).

Next, the resin film was irradiated with a UV ray (wavelength: 365 nm) at 0.6 J/cm² via a negative type photomask 5 having a pattern of a line width/line space=50/75 and 50/50 μm by means of the UV ray exposing device described above (refer to FIG. 1(c)), and then it was heated after exposed at 80° C. for 5 minutes.

Thereafter, the PET film (A1517) which was the base film was peeled off, and the corer pattern was developed by using a developer (propylene glycol monomethyl ether acetate/N,N-dimethylacetamide=7/3, mass ratio) (refer to FIG. 1(d)).

Subsequently, the resin film was washed by a washing liquid (isopropanol) and dried by heating at 100° C. for 10 minutes.

Then, the resin film for forming a cladding layer described above as an upper cladding layer was laminated on the same laminating conditions as described above, and the base film was peeled off after irradiated with a UV ray (wavelength: 365 nm) at 3 J/cm². Thereafter, the resin film was subjected to heat treatment at 160° C. for one hour, whereby an upper cladding layer 7 was formed to obtain a hybrid optical/electrical circuit board having a pattern of a line width/line space=50/75 and 50/50 μm (refer to FIG. 1(e)).

Then, the hybrid optical/electrical circuit board was cut into a length of 10 cm by means of a dicing saw (DAD-341, manufactured by DISCO Corporation).

The refractive indices of the core layer and the cladding layer were measured by means of a prism coupler (Model 2010, manufactured by Metricon Co., Ltd.) to find that a refractive index of the core layer was 1.584 at a wavelength of 830 nm and that a refractive index of the cladding layer was 1.550.

Also, a propagation loss of the optical waveguide prepared was measured by a cutback method (length of the waveguide measured: 10, 5, 3 and 2 cm, incoming fiber: GI-50/125 multimode fiber (NA=0.20), outgoing fiber: SI-114/125 (NA=0.22)) using a vertical cavity surface emitting laser (FLS-300-01-VCL, manufactured by Electro-Optical Engineering Inc.) of 850 nm for a light source and Q8221 manufactured by Advantest Corporation for a light-sensitive sensor to find that the propagation loss was 0.1 dB/cm.

Further, the above optical waveguide was allowed to pass three times through a reflow soldering test with the condition of a highest temperature at 265° C. (holding time at 260° C. or higher: 20 seconds) under nitrogen atmosphere, and an increase in loss caused by reflow soldering test was measured to find that it was 0.03 dB/cm and sufficiently small. The results thereof are shown in Table 3.

Comparative Example 3

A hybrid optical/electrical circuit board was prepared in the same manner as in Example 2, except that in preparing the printed wiring board in Example 2, a resin composition vanish which was not blended with the disazo base dye was used.

In this case, an optical waveguide having a pattern of a line width/line space=50/75 and 50/50 μm could not be formed. The results thereof are shown in Table 3.

Comparative Example 4

A hybrid optical/electrical circuit board was prepared in the same manner as in Example 1, except that in preparing the printed wiring board in Example 2, the disazo base dye was not blended and that a proportion of the inorganic filler based on the total amount of the resin composition solid matters was changed to 15% by volume.

In this case, an optical waveguide having a pattern of a line width/line space=50/75 and 50/50 μm could not be formed. The results thereof are shown in Table 3.

TABLE 3

| Items | Example 2 | Comparative Example 3 | Comparative Example 4 |
|---|---|---|---|
| Inorganic filler content (% by volume) | 41 | 41 | 15 |
| Black dye | Added | None | None |
| Reflectance (%)*1 | 0.2 | 0.3 | 0.3 |
| Formation of optical waveguide having a pitch of 125 μm (line width 50 μm/line space 75 (μm) | Yes | No | No |
| Formation of optical waveguide having a pitch of 100 μm (line width 50 μm/line space 75 μm) | Yes | No | No |
| Propagation loss of optical waveguide (dB/cm) | 0.1 | — | — |
| Increase in loss caused by reflow soldering test (dB/cm) | 0.03 | — | — |

*measured wavelength: 365 nm

INDUSTRIAL APPLICABILITY

The hybrid optical/electrical circuit board of the present invention comprises a printed wiring board which is excellent in mechanical characteristics and thermal characteristics and an optical waveguide having a high resolution. This makes it possible to apply the hybrid optical/electrical circuit board to the broad fields such as optical interconnection and the like.

An optical waveguide can be produced at a good productivity by using a resin film for forming an optical waveguide for at least one of a core, a lower cladding and an upper cladding of the optical waveguide.

What is claimed is:

1. A hybrid optical/electrical circuit board in which an optical waveguide prepared by an exposing and developing step is combined with an electric circuit, wherein a printed wiring board containing an inorganic filler and a light absorber is used, and wherein a surface of the printed wiring board has a reflectance of 0.2% or less in a wavelength of an exposing light used for forming the optical waveguide.

2. The hybrid optical/electrical circuit board according to claim 1, wherein a resin film for forming an optical waveguide is used for at least one of a core and a cladding layer of the optical waveguide.

3. The hybrid optical/electrical circuit board according to claim 1, wherein a blending amount of the light absorber is 0.01 to 2% by mass based on a thermosetting resin composition also included in the printed wiring board.

4. The hybrid optical/electrical circuit board according to claim 1, wherein said reflectance is 0.18% or less.

5. The hybrid optical/electrical circuit board according to claim 4, wherein said reflectance is 0.15% or less.

6. The hybrid optical/electrical circuit board according to claim 1, wherein said light absorber reduces scattering and reflecting of the exposing light by the inorganic filler.

7. A hybrid optical/electrical circuit board in which an optical waveguide prepared by an exposing and developing step is combined with an electric circuit, wherein a printed wiring board containing an inorganic filler and a light absorber is used, wherein the light absorber is a black dye, and wherein a surface of the printed wiring board has a reflectance of 0.2% or less in a wavelength of an exposing light used for forming the optical waveguide.

8. The hybrid optical/electrical circuit board according to claim 7, wherein a resin film for forming an optical waveguide is used for at least one of a core and a cladding layer of the optical waveguide.

9. The hybrid optical/electrical circuit board according to claim 7, wherein said black dye is a material selected from the group consisting of metal complex salt azo base black dyes, disazo base black dyes, azine base black dyes, and phthalocyanine base black dyes.

10. The hybrid optical/electrical circuit board according to claim 7, wherein said black dye is an organic dye.

11. The hybrid optical/electrical circuit board according to claim 7, wherein said light absorber reduces scattering and reflecting of the exposing light by the inorganic filler.

* * * * *